(12) United States Patent
Chevalier (10) Patent No.: US 11,868,044 B2
(45) Date of Patent: Jan. 9, 2024

(54) PREPOLYMER COMPOSITION INTENDED TO FORM A CONTRAST LAYER AND METHOD FOR STRUCTURING AN INTERFACE MATERIAL

(71) Applicant: ARKEMA FRANCE, Colombes (FR)

(72) Inventor: Xavier Chevalier, Grenoble (FR)

(73) Assignee: Arkema France, Colombes (FR)

( * ) Notice: Subject to any disclaimer, the term of this patent is extended or adjusted under 35 U.S.C. 154(b) by 0 days.

(21) Appl. No.: 17/785,324

(22) PCT Filed: Dec. 29, 2020

(86) PCT No.: PCT/EP2020/088006
§ 371 (c)(1),
(2) Date: Jun. 14, 2022

(87) PCT Pub. No.: WO2021/136793
PCT Pub. Date: Jul. 8, 2021

(65) Prior Publication Data
US 2023/0063847 A1 Mar. 2, 2023

(30) Foreign Application Priority Data
Dec. 31, 2019 (FR) ..................................... 1915800

(51) Int. Cl.
*G03F 7/00* (2006.01)
*C08J 3/24* (2006.01)
(Continued)

(52) U.S. Cl.
CPC ............ *G03F 7/0002* (2013.01); *C08J 3/243* (2013.01); *G03F 7/038* (2013.01); *G03F 7/091* (2013.01); *G03F 7/095* (2013.01)

(58) Field of Classification Search
CPC ........ G03F 7/0002; G03F 7/038; G03F 7/091; G03F 7/095; C08J 3/243
(Continued)

(56) References Cited

U.S. PATENT DOCUMENTS 6,168,836 B1 1/2001 Kukanskis et al.
2007/0286959 A1 12/2007 Palmer
(Continued)

FOREIGN PATENT DOCUMENTS

FR 3074180 A1 5/2019

OTHER PUBLICATIONS

A translation of the International Search Report Issued in PCT/EP2020/088006; dated Mar. 19, 2021 (2 pages).
(Continued)

*Primary Examiner* — Caleen O Sullivan
(74) *Attorney, Agent, or Firm* — Pearne & Gordon LLP (57) ABSTRACT

The invention relates to a crosslinkable prepolymer composition for use as a contrast layer. It also relates to a method for structuring an interface material. This method is characterized in particular by the following steps:
depositing, on a block copolymer film, a prepolymer composition layer comprising a plurality of functional monomers and at least one crosslinkable functional group within its polymer chain and, on the other hand, two chemically different crosslinking agents, each agent being capable of initiating the crosslinking of said prepolymer in response to a stimulation specific thereto,
subjecting the stack to a first stimulation localized on first areas, so as to cause a crosslinking reaction of the molecular chains of said prepolymer, and subjecting the stack to a second stimulation, so as to cause crosslink-
(Continued)

ing of the molecular chains of said prepolymer by the action of said second crosslinking agent in secondary areas.

23 Claims, 3 Drawing Sheets

(51) Int. Cl.
*G03F 7/038* (2006.01)
*G03F 7/09* (2006.01)
*G03F 7/095* (2006.01)

(58) Field of Classification Search
USPC .......................................... 438/703
See application file for complete search history.

(56) References Cited

U.S. PATENT DOCUMENTS

2020/0371437 A1\* 11/2020 Chevalier ............... G03F 7/038
2020/0379339 A1\* 12/2020 Chevalier ............. G03F 7/0002

OTHER PUBLICATIONS

Written Opinion Issued in PCT/EP2020/088006 (with English translation); dated Mar. 19, 2021. 12 pages.

\* cited by examiner

PREPOLYMER COMPOSITION INTENDED TO FORM A CONTRAST LAYER AND METHOD FOR STRUCTURING AN INTERFACE MATERIAL

FIELD OF THE INVENTION

The present invention relates to the field of directed self-assembly, also called DSA (from the English acronym "Directed Self-Assembly"), nanolithography.

More particularly, the invention relates to a prepolymer composition intended to be crosslinked and used as a contrast layer in a polymer stack.

The invention further relates to a top coat-like interface material, intended to be deposited on a block copolymer film, and more particularly to the structuring of such a material.

PRIOR ART

Figure 1:
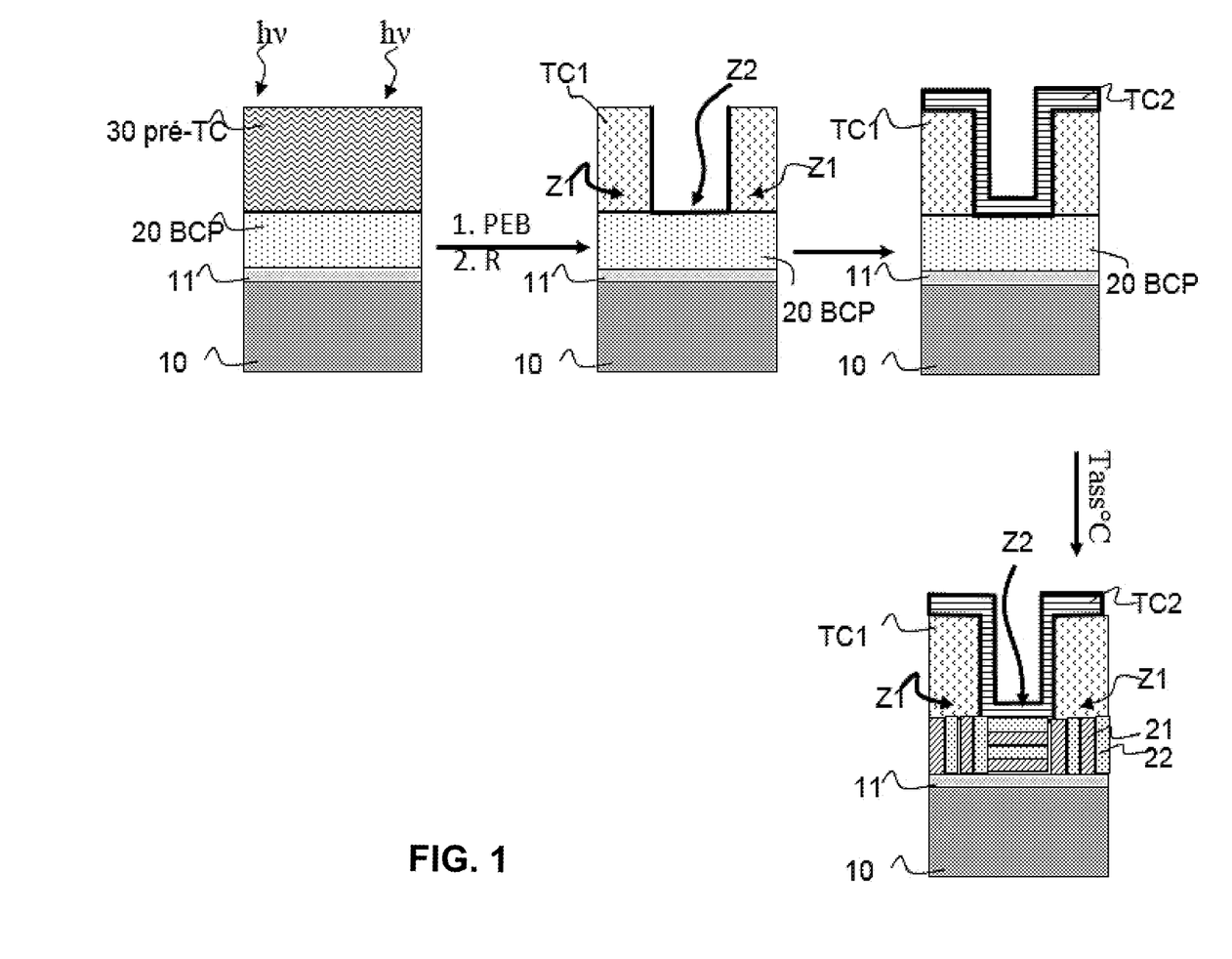
FIG. 1, already described, a diagram of a known method for obtaining areas in a block copolymer film, in which the nanodomains are oriented perpendicular or parallel to the interfaces according to the affinity of the crosslinked top coat and arranged above each of these areas.

In the field of directed self-assembly, or DSA, nanolithography, block copolymers, capable of nanostructuring at an assembly temperature, are used as nanolithography masks. To do this, systems of stacks of liquid/viscous materials are used. These stacks comprise a solid substrate 10, as shown in FIG. 1, on which is deposited at least one film 20 of block copolymer, subsequently denoted BCP. This block copolymer BCP film, intended to form a nanolithography mask, is necessarily in a liquid/viscous state at the assembly temperature, so it can self-organize into nanodomains, due to a phase segregation between the blocks. By "liquid or viscous polymer" is meant a polymer which has, at a temperature above the glass transition temperature, as a result of its rubbery state, an increased capacity for deformation due to the possibility given to its molecular chains to move freely. However, hydrodynamic phenomena at the origin of dewetting appear as long as the material is not in a solid state, that is to say non-deformable due to the negligible mobility of its molecular chains. This dewetting phenomenon is characterized by the spontaneous shrinkage of the polymer film applied to the surface of the underlying layer, when the initial stack system is left to evolve freely over time. Loss of continuity of the initial film and a variation in thickness then arise. The film does not spread and forms one or more spherical caps/droplets, giving rise to a non-zero contact angle with the underlying surface. Consequently, since the block copolymer film deposited on the surface of the substrate 10 is in a liquid/viscous state to be able to self-organize at the assembly temperature, it is therefore subject to dewetting phenomena when brought to its assembly temperature.

In the context of directed self-assembly nanolithography of block copolymers, a flat, that is to say no dewet, block copolymer film is sought with nanodomains 21, 22 perpendicular to the interfaces in order to be able to transfer these nanodomains into the underlying substrate 10 to create dimensionally controlled patterns, useful for microelectronics applications.

Where appropriate, it is desirable to be able to obtain preferential areas on the block copolymer film where only those areas have perpendicular patterns, and where the entire film has not dewet.

In order to address these issues, the applicant showed, in patent applications FR 3 074 180 and FR 3 074 179, that the crosslinking of top coat, subsequently denoted TC, films with neutral affinity with respect to the blocks of the underlying block copolymer, allowed flat block copolymer films and top coat films to be obtained, thanks to the mechanical stress imposed by crosslinking the top coat. To this end, a crosslinking activator, such as a photo-generated acid PAG, a photo-generated base PBG, or a radical generator for example, is incorporated into the pre-TC top coat material and an appropriate stimulation of the activator, for example by UV radiation or an electron beam or thermal treatment, allows the top coat film TC to be crosslinked.

Such crosslinking of the top coat film can furthermore be carried out in a localized manner, through a lithography mask, in order to obtain localized crosslinking of the top coat with areas crosslinked and neutral with respect to the underlying block copolymer blocks, referenced Z1 in FIG. 1, and non-crosslinked areas. Such localized crosslinking is intended to create specific areas in the underlying block copolymer 20, located under the crosslinked neutral areas Z1 of the top coat TC1, where the nanodomains are oriented perpendicular to the substrate surface after annealing at the assembly temperature. However, in this case, the method followed to create specific areas of the block copolymer where the nanodomains are oriented perpendicular to the substrate surface is difficult to implement. Indeed, after the lithography step, allowing some areas Z1 of the top coat TC1 to be locally crosslinked, it is necessary to remove the non-irradiated and thus non-crosslinked areas Z2 of top coat material TC1, and then replenish these with a second top coat TC2 of an affinity opposite to the first one (that is to say if the first TC1 is neutral, then the second TC2 is non-neutral, and vice versa), and crosslink this second top coat TC2 in order to obtain the flatness of the underlying block copolymer film 20 in these same areas. Conversely, if a second top coat TC2 is not used and then crosslinked to ensure flatness of the underlying BCP film, the block copolymer may be free to dewet from these areas, which can be problematic when reduced thicknesses of the first top coat TC1 are used.

The method described in these patent applications is therefore efficient, but time-consuming and costly to implement. It therefore appears necessary to find an even more efficient way for combining the different key points defining a top coat material for DSA, namely at least:

- orthogonality of the solvents of the top coat with respect to the underlying block copolymer,
- crosslinking properties of the top coat, to ensure flatness of the underlying block copolymer film,
- availability and reasonable method of synthesis of the constituents of the top coat material and of the material itself,
- homogeneity of the material when dispensed on the block copolymer film,
- property of neutrality and non-neutrality to the underlying block copolymer, and
- reduced number of steps necessary to obtain the final block copolymer pattern.

In addition, a secondary technical problem arises with regard to the whole method followed for obtaining areas of interest in the block copolymer, where the nanodomains are oriented perpendicular to the substrate. Indeed, when a second top coat TC2 is dispensed on an already crosslinked first area Z1 of a first top coat TC1 and on the adjacent holes (areas Z2 of the first top coat TC1 which are not crosslinked and are hollowed out by rinsing in a solvent), a significant difference in thickness is created between the initially crosslinked areas Z1 (top coat TC1 thickness+top coat TC2 thickness) and the areas Z2 which are hollowed out and filled only with the second crosslinked top coat TC2 (top coat TC2 thickness). This difference in thickness is detrimental to the final integration of the block copolymer film. Indeed, since the top coats TC1 and TC2 are removed by plasma etching, a plasma process is required which can effectively etch both top coats TC1 and TC2, but which has a barrier layer at the top of the block copolymer film, otherwise the initial thickness difference between the two top coats, (TC1+TC2) on the one hand, and TC2 on the other hand, can be at least partially transferred into the block copolymer film, making it more complex to use in the final application. However, it appears very difficult to find plasma conditions (gas chemistry, reactor type, parameters to be applied) allowing for a barrier layer on the block copolymer, even when the chemistries of the top coats and the different phases of the block copolymer are very dissimilar. It therefore appears necessary to also have a minimal difference in thickness between the different neutral and non-neutral areas of the top coats TC1+TC2 and TC2, respectively, in order to facilitate the implementation of the block copolymer.

Consequently, in the context of using stacks comprising block copolymers BCP in the form of thin films, intended to be used as nanolithography masks, for applications in organic electronics, it is imperative to be able to control not only that the block copolymer BCP film entirely covers the surface of the substrate under consideration without dewetting thereof, and that the top coat layer entirely covers the surface of the block copolymer without dewetting, but also that the top coat-like layer, deposited at the upper interface, can be structured in such a way as to have adjacent areas, the affinity with the blocks of the underlying block copolymer of which is the opposite, in order to obtain a block copolymer after nanostructuring with areas, the patterns of which are perpendicular to the interfaces, and areas where the patterns are parallel to the interfaces.

More generally, the applicant sought a solution to obtain a prepolymer composition intended to be crosslinked and form a contrast layer. Such a contrast layer can then be used in polymer stacks. In the context of the field of directed assembly DSA nanolithography, the contrast layer can, for example, form a top coat-like interface material layer deposited on a block copolymer, with the contrast being formed from adjacent areas, the affinity for the blocks of the underlying block copolymer of which is the opposite.

Technical Problem

The aim of the invention is thus to overcome at least one of the drawbacks of the prior art. In particular, the invention aims at providing a prepolymer composition intended to be crosslinked and form a contrast layer.

The invention also aims to provide a simple and effective method for structuring a top coat-like interface material, intended to be deposited on a block copolymer film and crosslinked to provide sufficient stress to prevent dewetting of said underlying block copolymer, said method further providing a chemical contrast within the interface material, by creating adjacent areas having an opposite affinity with respect to each other for the blocks of the underlying block copolymer.

BRIEF DESCRIPTION OF THE INVENTION

To this end, one object of the invention is a prepolymer composition intended to be crosslinked and form a contrast layer, said composition being characterized in that it comprises, on the one hand, a prepolymer comprising a plurality of functional monomers, and at least one crosslinkable functional group within its polymer chain and, on the other hand, two chemically different crosslinking agents, each agent being capable of initiating the crosslinking of said prepolymer in response to a stimulation specific thereto.

According to other optional characteristics of the prepolymer composition, the latter may optionally include one or more of the following features, alone or in combination:

one of the crosslinking agents, is able to react with a crosslinkable functional group and also with a functional monomer of the polymer chain. Such an additional reaction significantly increases the chemical contrast between the primary and secondary crosslinked areas, and thus the affinity contrast with respect to the blocks of the underlying block copolymer each crosslinking agent and reacts with a different crosslinkable functional group. Hence that the resulting contrast between the primary and secondary crosslinked areas is further enhanced both crosslinking agents and are carried by the polymer chain and each agent reacts with a different crosslinkable functional group.

one of the crosslinking agents, in addition to reacting with a crosslinkable functional group, different from the crosslinkable group with which the second crosslinking agent reacts, also reacts with a functional monomer of the polymer chain allowing to further increase the chemical contrast between the primary and secondary crosslinked areas Another object of the invention is a method for structuring an interface material deposited on a block copolymer film, said method being characterized in that it comprises the following steps:

depositing, on said block copolymer film, a prepolymer composition layer comprising, on the one hand, a plurality of functional monomers and at least one crosslinkable functional group within its polymer chain and, on the other hand, two chemically different crosslinking agents, each agent being capable of initiating the crosslinking of said prepolymer in response to a stimulation specific thereto, subjecting the stack thus created to a first stimulation localized on first areas, said first stimulation being selected from light radiation, ion bombardment, thermal stimulation, plasma, or an electrochemical process, so as to cause a crosslinking reaction of the molecular chains of said prepolymer by the action of said first crosslinking agent in said first areas subjected to said first stimulation, said first crosslinked areas obtained having a first affinity with respect to the blocks of the underlying block copolymer, subjecting the stack to a second stimulation, selected from light radiation, ion bombardment, thermal stimulation, plasma, or an electrochemical process, so as to cause a crosslinking reaction of the molecular chains of said prepolymer by the action of said second crosslinking agent in secondary areas, not crosslinked after the first stimulation, said crosslinked secondary areas obtained, adjacent to the first areas, having a second affinity with respect to the blocks of the underlying block copolymer, the second affinity being opposite to the first affinity.

Thus, the interface material, used as a top coat layer on a block copolymer film, has adjacent crosslinked areas, the surface energies of which are highly contrasted and such that the affinity with respect to the blocks of the underlying block copolymer is opposite. Thus, when the block copolymer self-organizes at its own assembly temperature, the nanodomains organize perpendicularly to the interfaces or parallel to the interfaces depending on whether they are located under a neutral area or under an affine area of the crosslinked interface material. In addition, the crosslinking of the interface material allows the movement of its molecular chains to be restricted and thus the possibility of dewetting of the top coat layer to be eliminated and the underlying block copolymer film to be stabilized, so that it does not dewet from its substrate.

According to other optional features of the method:
- the first crosslinking agent initiates crosslinking by reacting with a first crosslinkable functional group of the polymer chain, while the second crosslinking agent initiates crosslinking by reacting with a crosslinkable functional group identical to or different from the first one;
- one of the two crosslinking agents further reacts with at least one functional monomer of the polymer chain;
- either or both of the crosslinking agents is (are) carried by the polymer chain of said prepolymer;
- the functional monomers of the polymer chain of said prepolymer are acrylate or diacrylate or triacrylate or multi-acrylate, methacrylate, or multi-methacrylate, or polyglycidyl or vinyl, fluoroacrylate or fluoromethacrylate, vinyl fluoride or fluorostyrene, alkyl acrylate or methacrylate, hydroxyalkyl acrylate or methacrylate, alkylsilyl acrylate or methacrylate derivatives, unsaturated esters/acids such as fumaric or maleic acids, vinyl carbamates and carbonates, allyl ethers, and thiol-ene systems;
- the crosslinkable functional group(s) of the polymer chain of said prepolymer is (are) a derivative (derivatives) having chemical functions of the epoxy/oxirane, oxetane, thiirane or vinyl ether, cyclic ether, trioxane, vinyl, lactone, lactam, carbonate, thiocarbonate, maleic anhydride, or (meth)acrylate type substituted by a carbon chain having one or more unsaturations;
- the crosslinking agents are selected from: acids photo-generated from a salt selected from onium salts, such as iodonium, sulfonium, pyridinium, alkoxypyridinium, phosphonium, oxonium, or diazonium salts; bases photo-generated from derivatives selected from carbamates, acyloximes, ammonium salts, sulfonamides, formamides, amineimides, α-aminoketones, amidines; thermally activatable catalysts selected from chemical derivatives for generating a thermally activated acid proton, such as ammonium salts like ammonium triflate, ammonium trifluoroacetate, or ammonium trifluoromethane sulfonate, pyridinium salts such as pyridinium para-toluenesulfonate, phosphoric or sulfuric or sulfonic acids, or onium salts such as iodonium or phosphonium salts, or imidazolium salts, amines or polyamines, such as diethylene triamine (DTA), isophorone diamine (IPD), 4,4'-diaminodiphenylsulfone (DDS), hexamethylene diamine (HMDA), dicyandiamide (cyanoguanidine), or ascorbic acid and its derivatives, selected from sodium or magnesium ascorbate or sodium, magnesium or ammonium ascorbylphosphate, as well as the various possible isomers (diastereoisomers, enantiomers) of ascorbic acid; uric acid; phenol, polyphenols and phenolic derivatives such as hydroquinone, resorcinol, 2,4-pentanedione, malonaldehyde (propanedial), tartronaldehyde (2-hydroxypropanedial), furanone and more generally reductones; thermal radical initiators selected from derivatives of the organic peroxide type, or derivatives having an azo-type chemical function, such as azobisisobutyronitrile (AIBN), or derivatives of the alkyl halide type; radical photoinitiators selected from acetophenone, benzophenone, organic peroxides, phosphines, xanthones, thioxanthones, quinones, α-hydroxyketones or diazonaphthoquinone, α-aminoketones, benzil, benzoin derivative;
- each crosslinking agent is present in the prepolymer composition with a content less than or equal to 30% of the total mass of said prepolymer composition;
- the first localized stimulation is or is not carried out through a lithography mask, preferably a photolithography mask;
- the second localized stimulation is or is not carried out through a lithography mask;
- when the first stimulation and the second stimulation are of an identical nature, the selective activation of each activator is carried out by selecting a different stimulation setting;
- a preliminary step consists in depositing the block copolymer, capable of nanostructuring at an assembly temperature, on a surface of an underlying substrate previously neutralized, said neutralization of the underlying substrate being obtained by depositing and crosslinking a neutral underlayer of the carbon or fluorocarbon type, with a thickness greater than 1.5 times the thickness of the block copolymer film;
- a preliminary step consists in depositing the block copolymer, capable of nanostructuring at an assembly temperature, on a surface of an underlying substrate previously neutralized, said neutralization of the underlying substrate being obtained by depositing and grafting an underlayer of neutral random copolymer on the substrate;
- the neutral underlayer comprises either a photo-generated acid (PAG), a photo-generated base (PBG), or a radical generator of the photoinitiator (PI) type, directly integrated into the polymer chains of the underlayer material or added as an additive to the material;
- another preliminary step consists in predrawing patterns, on the previously neutralized surface of the substrate, said patterns being predrawn by a lithography step or a sequence of lithography steps of any nature prior to the step of depositing said block copolymer film, said patterns being intended to guide the organization of said block copolymer by a so-called chemoepitaxy or graphoepitaxy technique, or a combination of these two techniques.

According to another aspect, the invention concerns a prepolymer composition intended to be crosslinked and form a contrast layer, said composition being characterized in that it comprises, on the one hand, a prepolymer comprising a plurality of functional monomers, and at least one crosslinkable functional group within its polymer chain and, on the other hand, two chemically different crosslinking agents, each agent being capable of initiating the crosslinking of said prepolymer in response to a stimulation specific thereto.

According to other optional characteristics of the prepolymer composition, the latter may optionally include one or more of the following features, alone or in combination:
- one of the crosslinking agents, is able to react with a crosslinkable functional group and also with a functional monomer of the polymer chain;
- each crosslinking agent and reacts with a different crosslinkable functional group
- both crosslinking agents and are carried by the polymer chain and each agent reacts with a different crosslinkable functional group.

one of the crosslinking agents, in addition to reacting with a crosslinkable functional group, different from the crosslinkable group with which the second crosslinking agent reacts, also reacts with a functional monomer of the polymer chain.

Finally, one object of the invention is a contrast layer obtained by double crosslinking of the prepolymer composition described above, said contrast layer forming: a top coat-like upper interface material, deposited on a block copolymer film or an underlayer deposited at the interface between a substrate and a block copolymer film, or patterns, made on a previously neutralized surface of a substrate by a graphoepitaxy technique on the surface of a substrate and intended to guide the organization of a block copolymer.

Other features and advantages of the invention will become apparent upon reading the description given by way of illustrative and non-limiting example, with reference to the appended figures, which represent.

DESCRIPTION OF THE INVENTION

By "polymer" is meant either a copolymer (of the statistical, gradient, block, alternating type) or a homopolymer.

The term "monomer" as used refers to a molecule that can undergo polymerization.

The term "polymerization" as used refers to the method of transforming a monomer or mixture of monomers into a polymer of predefined architecture (block, gradient, statistical . . . ).

The term "prepolymer" as used refers to at least one monomer and/or dimer and/or oligomer and/or polymer having reactive groups allowing it to participate in subsequent polymerization and thus to incorporate several monomer units into at least one chain of the final macromolecule.

By "polymer chain of a prepolymer" is meant the main chain of assembly of a plurality of monomer units, with other less important chains being considered as branches of the polymer main chain.

By "copolymer" is meant a polymer combining several different monomer units.

By "statistical copolymer" is meant a copolymer in which the distribution of monomer units along the chain follows a statistical law, for example Bernoullian (zero-order Markov) or first- or second-order Markovian. When the repeating units are randomly distributed along the chain, the polymers were formed by a Bernoulli method and are called random copolymers. The term random copolymer is often used, even when the statistical process that prevailed during the synthesis of the copolymer is not known.

By "block copolymer" is meant a polymer comprising one or more uninterrupted sequences of each of the separate polymer species, with the polymer sequences being chemically different from each other and being bonded together by a chemical (covalent, ionic, hydrogen, or coordination) bond. These polymer sequences are also referred to as polymer blocks. These blocks have a phase segregation parameter (Flory-Huggins interaction parameter) such that, if the degree of polymerization of each block is greater than a critical value, they are not miscible with each other and separate into nanodomains.

The above-mentioned term "miscibility" refers to the ability of two or more compounds to completely blend to form a homogeneous or "pseudo-homogeneous" phase, that is to say without apparent crystalline or near-crystalline symmetry over short or long distances. The miscibility of a mixture can be determined when the sum of the glass transition temperatures (Tg) of the mixture is strictly less than the sum of the Tgs of the individual compounds taken alone.

In the description, reference is made both to "self-assembly" and to "self-organization" or to "nanostructuring" to describe the well-known phenomenon of phase separation of the block copolymers, at an assembly temperature also known as the annealing temperature.

By "neutral" or "pseudo-neutral" surface is meant a surface which, as a whole, does not have a preferential affinity with any of the blocks of a block copolymer. It thus allows an equitable or "pseudo-equitable" distribution of the blocks of the block copolymer on the surface.

Neutralization of the surface of a substrate allows such a "neutral" or "pseudo-neutral" surface to be obtained.

The surface energy (noted γx) of a given material "x" is defined as the excess energy at the surface of the material compared to that of the material within its bulk. When the material is in liquid form, its surface energy is equivalent to its surface tension.

When talking about surface energies or more precisely interfacial tensions of a material and a block of a given block copolymer, these are compared at a given temperature, and more precisely at a temperature allowing self-organization of the block copolymer.

By "lower interface" of a (co)polymer is meant the interface in contact with an underlying layer or substrate on which said (co)polymer is deposited.

By "upper interface" or "upper surface" of a (co)polymer is meant the interface in contact with an upper layer, known as the "top coat" and denoted TC, applied to the surface of the (co)polymer.

By "solvent orthogonal to a (co)polymer" is meant a solvent not capable of attacking or dissolving said (co)polymer.

By "liquid polymer" or "viscous polymer" is meant a polymer which, at a temperature greater than the glass transition temperature, has, due to its rubbery state, an increased capacity for deformation as a result of the possibility given to its molecular chains to move freely. The hydrodynamic phenomena at the origin of dewetting appear as long as the material is not in a solid state, that is to say non-deformable due to the negligible mobility of its molecular chains.

The applicant has developed a new prepolymer composition intended to be crosslinked and once crosslinked, form a contrast layer.

The applicant has also developed a new method, more particularly dedicated to the field of organic electronics by directed self-assembly, allowing a top coat-like interface material, deposited on a block copolymer film, to be structured so that, once crosslinked, the interface material has contrasted adjacent areas, said areas having an affinity with respect to the blocks of the underlying block copolymer, opposite with respect to each other.

Figure 2:
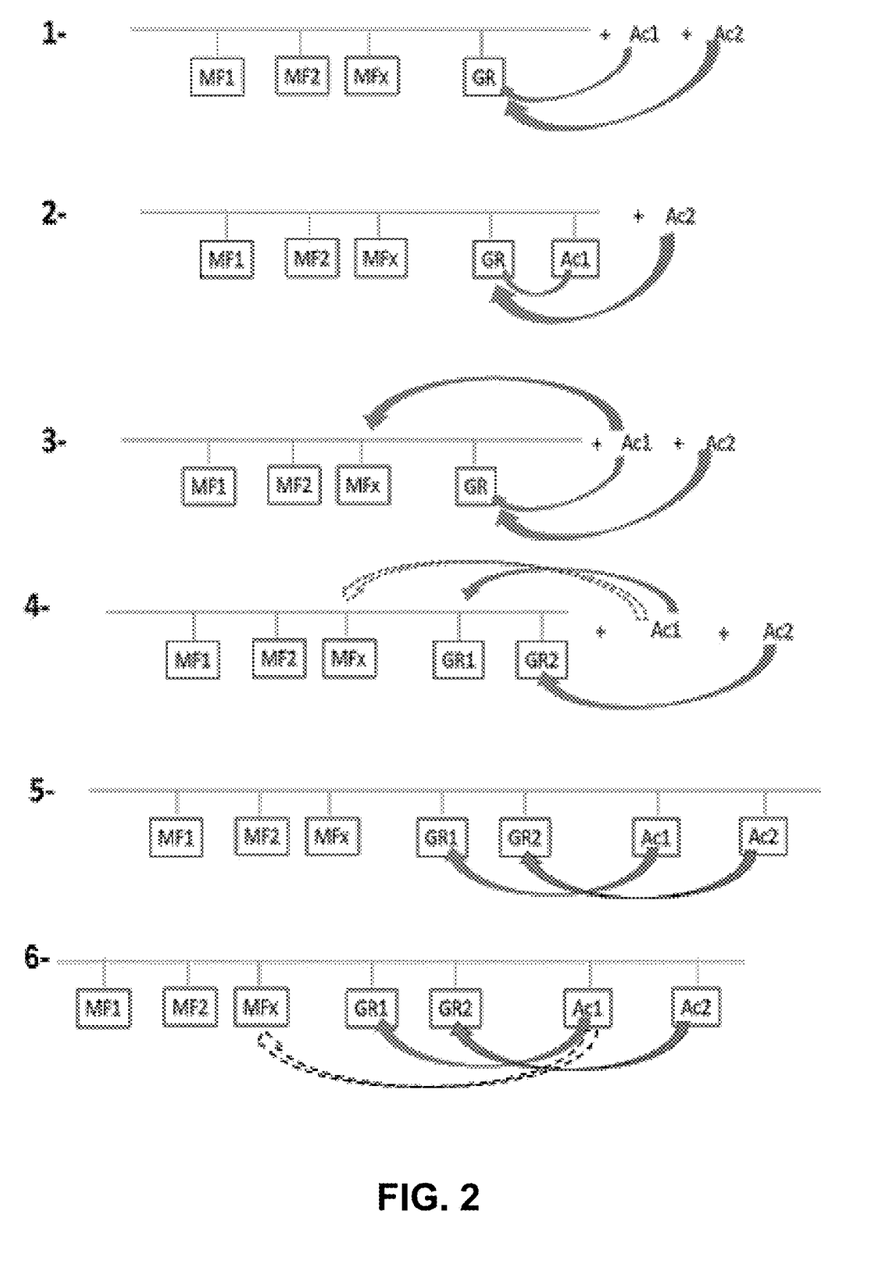
FIG. 2, a diagram of the different ways for obtaining a crosslinked material with a chemical contrast FIG. 3A A scanning electron microscope photograph of different areas of a nanostructured block copolymer after structuring an interface material by two successive crosslinking reactions of a first prepolymer composition.

The prepolymer on which the composition is based, as shown in FIG. 2, comprises a plurality of functional monomers MF1, MF2, ... MFx and at least one crosslinkable functional group GR, GR1, GR2 within its polymer chain. The prepolymer composition also comprises two chemically different crosslinking agents Ac1, Ac2, each agent being capable of initiating the crosslinking of the prepolymer in response to a stimulation specific thereto. As shown in FIG. 2, the functional monomers MF1, MF2 ... MFx and the crosslinkable functional groups GR, GR1, GR2 are carried by the polymer chain of the prepolymer, which is shown by a line. Either or both of the two crosslinking agents Ac1, Ac2 of the prepolymer composition may be carried by the polymer chain of the prepolymer, as shown in the crosslinking pathways 2, 5, and 6 of FIG. 2, or may not be as in the crosslinking pathways 1, 3, and 4.

Such a prepolymer composition can be deposited as a layer on a support such as a substrate, a layer of any polymer or a block copolymer film, for example. This deposition is preferably carried out by spin coating or "spin coating".

When the prepolymer composition is deposited on a block copolymer film, it is preferably formulated in a solvent orthogonal to the block copolymer in order to avoid any re-dissolution of the block copolymer in the solvent of the prepolymer composition layer at the time of the deposition step. The solvents in each respective layer will therefore be highly dependent on the chemical nature of the block copolymer already deposited on the substrate. Thus, if the block copolymer already deposited is low polar/protic, since its solvent is selected from low polar and/or low protic solvents, the prepolymer composition layer can thus be solubilized and deposited on the first block copolymer layer from rather polar and/or protic solvents. Conversely, if the block copolymer already deposited is rather polar/protic, the solvents of the prepolymer layer may be selected from low-polar and/or low-protic solvents. According to a preferential embodiment of the invention, but without this being restrictive in view of what has been stated above, the prepolymer layer is deposited from polar and/or protic solvents/mixture of solvents. More precisely, the polarity/proticity properties of the different solvents are described according to Hansen's nomenclature of solubility parameters (Hansen, Charles M. (2007) *Hansen solubility parameters: a user's handbook*, CRC Press, ISBN 0-8493-7248-8), where the designation "$\delta_d$" represents the forces of dispersion between solvent/solute molecules, "$\delta_p$" represents the energy of dipole forces between molecules, and "$\delta_h$" represents the energy of possible hydrogen bonding forces between molecules, the values of which are tabulated at 25° C. In the context of the invention, "polar and/or protic" is defined as a solvent/molecule or solvent mixture having a polarity parameter such that $\delta_p \geq 10$ MPa$^{1/2}$ and/or a hydrogen bonding parameter such that $\delta_h \geq 10$ Mpa$^{1/2}$. Similarly, a solvent/molecule or solvent mixture is defined as "low polar and/or protic" when Hansen's solubility parameters are such that $\delta_p < 10$ Mpa$^{1/2}$ and/or $\delta_h < 10$ Mpa$^{1/2}$, and preferably $\delta_p \leq 8$ Mpa$^{1/2}$ and/or a hydrogen bonding parameter such that $\delta_h \leq 9$ Mpa$^{1/2}$.

According to a preferred but non-restrictive embodiment of the invention, the solvent for the prepolymer composition layer is selected from the compounds having a hydroxy function, for instance alcohols such as methanol, ethanol, isopropanol, 1-methoxy-2-propanol, ethyl lactate; or diols such as ethylene glycol, propylene glycol or propylene glycol methyl ether (PGME); or from dimethyl sulfoxide (DMSO), dimethylformamide, dimethylacetamide, acetonitrile, gammabutyrolactone, water, or a mixture thereof.

More generally, in the context of one of the preferential but non-exhaustive embodiments of the invention, the various constituents of the prepolymer composition are soluble and stable in solvents, the Hansen solubility parameters of which are such that $\delta_p \geq 10$ MPa$^{1/2}$ and/or $\delta_h \geq 10$ MPa$^{1/2}$ as defined previously, and with the dispersion parameter $\delta_d < 25$ MPa$^{1/2}$.

The prepolymer composition can, however, be used, in one embodiment variant, without solvent.

A first stimulation of the prepolymer composition layer, located on first areas, allows for a crosslinking reaction of the molecular chains of the prepolymer by reacting the first crosslinking agent Ac1 on a crosslinkable functional group GR, GR1, in said first areas subjected to said first stimulation. Thus, the first crosslinked areas obtained have a first chemical structure.

A second stimulation of the prepolymer composition layer, located on secondary areas not crosslinked after the first stimulation, allows for a crosslinking reaction of the molecular chains of the prepolymer by reacting said second crosslinking agent Ac2 on a crosslinkable functional group GR, GR2, in said secondary areas. Thus, the secondary crosslinked areas obtained, adjacent to the first areas, have a second chemical structure, different from the chemical structure of the first areas, thus allowing a contrast to be obtained.

Thus, a localized double crosslinking of the prepolymer composition layer allows a contrast layer to be obtained.

In the field of organic electronics, and in particular in the manufacture of nanolithography masks by block copolymer directed self-assembly (DSA) nanolithography, the contrast obtained lies in a difference in surface energy between the primary and secondary areas, some areas having a surface energy such that the affinity with respect to the blocks of the underlying or overlying copolymer is neutral, while the other areas have a surface energy such that they have a preferential affinity for one of the blocks of the underlying or overlying block copolymer.

The affinity contrast with respect to the underlying, or overlying, copolymer between the crosslinked primary and secondary areas can be measured by measuring the difference in surface energies between said areas. To this end, the surface energy of the individual areas of the crosslinked layer is measured using the OWRK (from the English acronym "Owens-Wendt-Rabel-Kaelble") method (https://www.kruss-scientific.com/services/education-theory/glossary/owens-wendt-rabel-and-kaelble-owrk-method/) or the static drop method, which consists in measuring the contact angle of a drop of liquid deposited on a solid substrate by means of a goniometer.

Such a contrast layer can then advantageously be used to form an underlayer at the lower interface between the substrate and the block copolymer. In this case, the contrast layer may have adjacent areas which are neutral or affine with respect to the block copolymer, respectively. Similarly, such a contrast layer can be a top coat-like upper interface material, deposited on a block copolymer film. In this case too, the contrast layer may have adjacent areas which are neutral or affine with respect to the block copolymer, respectively. Finally, such a contrast layer can also be used to form patterns, produced by a graphoepitaxy technique on the surface of a substrate, prior to the deposition of a block copolymer, said patterns being intended to guide the organization of the block copolymer. In this case, the patterns may alternately have a neutral or non-neutral affinity with respect to the blocks of a block copolymer subsequently deposited between these patterns.

In the particular case of a method for structuring a top coat-like interface material, deposited on a block copolymer film, a prepolymer composition layer is deposited on the block copolymer film and the stack thus created is successively subjected to a first localized stimulation on first areas, and then to a second localized stimulation on secondary areas which are not crosslinked after the first stimulation.

In this case, the reaction of the first crosslinking agent Ac1 with a first crosslinkable functional group GR, GR1, in the primary areas subjected to the first stimulation allows first crosslinked areas having a first affinity with respect to the blocks of the underlying block copolymer to be obtained. The subsequent reaction of the second crosslinking agent Ac2 with a crosslinkable functional group GR identical to the first or GR2 different from the first, in the secondary areas which are not crosslinked after the first stimulation and subjected to the second stimulation, allows crosslinked secondary areas having a second affinity with respect to the blocks of the underlying block copolymer to be obtained, the second affinity being opposite to the first affinity. Such a crosslinked and contrasting interface material allows, at the time of nanostructuring of the underlying block copolymer, at its assembly temperature, areas in the block copolymer in which the nanodomains are oriented perpendicular to the interfaces and other areas in which the nanodomains are oriented parallel to the interfaces, to be created. More particularly, the areas of the block copolymer located under areas of the interface material having neutral affinity comprise nanodomains oriented perpendicular to the interfaces, while the areas of the block copolymer located under affine areas of the interface material comprise nanodomains oriented parallel to the interfaces.

The assembly temperature depends on the block copolymer used. In general, it is higher than 100° C. Preferably, it is higher than 150° C., and even more preferably, it is higher than 200° C., while being lower than a possible degradation temperature of said block copolymer.

Preferably, the functional monomers MF1, MF2, . . . , Mfx of the polymer chain of the prepolymer are acrylate or diacrylate or triacrylate or multi-acrylate, methacrylate, or multi-methacrylate, or polyglycidyl or vinyl, fluoroacrylate or fluoromethacrylate, vinyl fluoride or fluorostyrene, alkyl acrylate or methacrylate, hydroxyalkyl acrylate or methacrylate, alkylsilyl acrylate or methacrylate derivatives, unsaturated esters/acids such as fumaric or maleic acids, vinyl carbamates and carbonates, allyl ethers, and thiol-ene systems.

The crosslinkable functional group(s) GR, GR1, GR2 of the polymer chain of said prepolymer is (are) a derivative (derivatives) having chemical functions of the epoxy/oxirane, oxetane, thiirane or vinyl ether, cyclic ether, trioxane, vinyl, lactone, lactam, carbonate, thiocarbonate, maleic anhydride, (meth)acrylate type substituted by a carbon chain having one or more unsaturations (sp or sp2 carbons).

The crosslinking agents Ac1, Ac2 are advantageously selected from:
  acids photo-generated (noted PAG) from a salt selected from onium salts, such as iodonium, sulfonium, pyridinium, alkoxypyridinium, phosphonium, oxonium, or diazonium salts;
  bases photo-generated (noted PBG) from derivatives selected from carbamates, acyloximes, ammonium salts, sulfonamides, amineimides, α-aminoketones, amidines;
  thermally activatable catalysts (ThCa) selected from chemical derivatives for generating a thermally activated acid proton, such as ammonium salts like ammonium triflate, ammonium trifluoroacetate, or ammonium trifluoromethane sulfonate, pyridinium salts such as pyridinium para-toluenesulfonate, phosphoric or sulfuric or sulfonic acids, or onium salts such as iodonium or phosphonium salts, or imidazoliumsalts, amines or polyamines, such as diethylene triamine (DTA), isophorone diamine (IPD), 4,4'-diaminodiphenylsulfone (DDS), hexamethylene diamine (HMDA), dicyandiamide (cyanoguanidine), or ascorbic acid and its derivatives, selected from sodium or magnesium ascorbate or sodium, magnesium or ammonium ascorbylphosphate, as well as the various possible isomers (diastereoisomers, enantiomers) of ascorbic acid; uric acid; phenol, polyphenols and phenolic derivatives such as hydroquinone, resorcinol, 2,4-pentanedione, malonaldehyde (propanedial), tartronaldehyde (2-hydroxypropanedial), furanone and more generally reductones;
  thermal radical initiators (noted TRI) selected from derivatives of the organic peroxide type, or derivatives having an azo-type chemical function, such as azobisisobutyronitrile (AIBN), or derivatives of the alkyl halide type;
  radical photoinitiators (noted PI) selected from acetophenone, benzophenone, organic peroxides, phosphines, xanthones, thioxanthones, quinones, α-hydroxyketones or diazonaphthoquinone, α-aminoketones, benzil, benzoin derivatives.

The selection of the crosslinking agents depends in particular on the nature of the crosslinkable functional group(s) GR, GR1, GR2 present in the polymer chain of the prepolymer. Thus, for example, if the polymer chain carries a crosslinkable functional group having epoxy/oxirane/oxetane functions, the activator may be selected from PAGs or PBGs. If the polymer chain of the prepolymer carries a crosslinkable functional group having (meth)acrylates substituted by a carbon chain having one or more unsaturations, the activator may be selected from PIs.

As regards the underlying block copolymer film to be nanostructured, it comprises "n" blocks, with n being any integer greater than or equal to 2. The block copolymer BCP is more specifically defined by the following general formula:

A-b-B-b-C-b-D-b- . . . -b-Z        [Chem1]

where A, B, C, D, . . . , Z are as many blocks "i" . . . "j" representing either pure chemical entities, that is to say each block is a set of monomers of identical chemical natures, polymerized together, or a set of comonomers, copolymerized together in the form, in whole or in part, of a block or statistical or random or gradient or alternating copolymer.

Each of the blocks "i" . . . "j" of the block copolymer BCP to be nanostructured can therefore potentially be written as: i=ai-co-bi-co- . . . -co-zi, with i≠ . . . ≠j, in whole or in part.

The volume fraction of each entity ai . . . zi can range from 1 to 99%, by monomer units, in each of the blocks i . . . j of the block copolymer BCP.

The volume fraction of each of the blocks i . . . j may range from 5 to 95% of the block copolymer BCP.

The volume fraction is defined as the volume of an entity relative to that of a block, or the volume of a block relative to that of the block copolymer.

The volume fraction of each entity of a block of a copolymer, or of each block of a block copolymer, is measured as described below. Within a copolymer in which at least one of the entities, or one of the blocks if it is a block copolymer, includes several co-monomers, it is possible to measure, by proton NMR, the molar fraction of each monomer in the whole copolymer, and then to go back to the mass fraction using the molar mass of each monomer unit. To obtain the mass fractions of each entity of a block, or each block of a copolymer, it is then sufficient to add the mass fractions of the constituent co-monomers of the entity or block. The volume fraction of each entity or block can then be determined from the mass fraction of each entity or block and the density of the polymer forming the entity or block. However, it is not always possible to obtain the density of the polymers, the monomers of which are copolymerized. In this case, the volume fraction of an entity or block is determined from its mass fraction and the density of the compound that represents the mass majority of the entity or block.

The molecular weight of the block copolymer BCP can range from 1000 to 500,000 g.mol$^{-1}$.

The block copolymer BCP can have any type of architecture: linear, star (three- or multi-arm), graft, dendritic, comb.

Each of the blocks i, . . . j of a block copolymer has a surface energy denoted γi . . . γj, which is specific thereto and which is a function of its chemical constituents, that is to say the chemical nature of the monomers or co-monomers constituting it. Similarly, the materials constituting a substrate each have their own surface energy value.

Each of the blocks i, . . . j of the block copolymer also has an interaction parameter of Flory-Huggins type, denoted: $\chi ix$, when it interacts with a given material "x", which can be a gas, a liquid, a solid surface, or another polymer phase for example, and an interfacial energy denoted "γix", with γix=γi−(γx cos θix), where θix is the contact angle between the materials i and x. The interaction parameter between two blocks i and j of the block copolymer is thus denoted $\chi ij$.

There is a relationship between γi and the Hildebrand's solubility parameter δi of a given material i, as described in document Jia et al., Journal of Macromolecular Science, B, 2011, 50, 1042. In fact, the Flory Huggins interaction parameter between two given materials i and x is indirectly related to the surface energies γi and γx specific to the materials, so one can either speak in terms of surface energies or in terms of interaction parameter to describe the physical phenomenon appearing at the interface of the materials.

When referring to the surface energies of a material and those of a given block copolymer BCP, it is implied that the surface energies are compared at a given temperature, and this temperature is the temperature (or at least part of the temperature range) at which the BCP can self-organize.

Preferably, in such a polymer stack dedicated to an application in the field of organic electronics, comprising a top coat-like interface material deposited on a block copolymer film previously deposited on the surface of a substrate, the surface of the substrate is previously neutralized 11, or pseudo-neutralized.

To this end, a first embodiment consists in depositing and grafting, on the surface of the substrate, a layer of random copolymer not exhibiting, overall, any preferential affinity for the blocks of the block copolymer.

Another embodiment, to neutralize 11 the surface of the substrate, consists in depositing a carbon or fluorocarbon type neutral layer, over a thickness greater than 1.5 times the thickness of the block copolymer film. This carbon or fluorocarbon neutral layer, once deposited on the substrate, is crosslinked in whole or in part. The stack can then be optionally rinsed, for example with the same solvent as the one for depositing the neutral layer, in order to remove possibly non-crosslinked and/or undesirable areas of the film. The carbon or fluorocarbon neutral layer has a chemical structure wholly or partly of the acrylate or methacrylate type based on co-monomers selected from (meth)acrylic monomers such as hydroxyalkyl acrylates like 2-hydroxyethyl acrylate, glycidyl acrylates, dicyclopentenyloxyethyl acrylates, fluorinated methacrylates such as 2,2,2-trifluoroethyl methacrylate, tert-butyl acrylate or methacrylate, alone or as a mixture of at least two of the aforementioned co-monomers.

In addition, optionally, patterns may be predrawn on the previously neutralized 11 surface of the substrate 10, by a lithography step or a sequence of lithography steps of any nature prior to the step of depositing the block copolymer film. These patterns are intended to guide the organization of said block copolymer and are produced by a so-called chemoepitaxy or graphoepitaxy technique, or a combination of these two techniques. Graphoepitaxy uses a topological constraint to force the block copolymer to organize in a predefined space commensurable with the periodicity of the block copolymer. To this end, graphoepitaxy consists in forming primary patterns, called guides, on the surface of the substrate. These guides, of any chemical affinity with respect to the blocks of the block copolymer, delimit areas within which a layer of block copolymer is deposited. The guides allow the organization of the blocks of the block copolymer to be controlled to form secondary patterns of a higher resolution, inside these areas. Conventionally, the guides are formed by photolithography. By way of example, among the possible solutions, if the intrinsic chemistry of the monomers constituting the block copolymer allows it, a statistical copolymer with a judiciously selected ratio of the same monomers as those of the block copolymer BCP can be grafted on the substrate, thereby balancing the initial affinity of the substrate for the block copolymer BCP. For example, this is the conventional method of choice for a system comprising a block copolymer such as PS-b-PMMA and described in the article by Mansky et al., Science, 1997, 275, 1458. Chemoepitaxy, on the other hand, uses a chemical affinity contrast between a pattern predrawn on the substrate and the different blocks of the block copolymer. Thus, a pattern having a high affinity for only one of the blocks of the block copolymer is predrawn on the surface of the underlying substrate, to allow perpendicular orientation of the blocks of the block copolymer, while the rest of the surface has no particular affinity for the blocks of the block copolymer. To this end, on the surface of the substrate is deposited a layer comprising, on the one hand, neutral areas (consisting, for example, of a graft statistical copolymer) which do not have any particular affinity for the blocks of the block copolymer to be deposited and, on the other hand, affine areas (consisting, for example, of a graft homopolymer of one of the blocks of the block copolymer to be deposited and serving as an anchor point for this block of the block copolymer). The homopolymer serving as an anchoring point can be produced with a width slightly greater than that of the block with which it has a preferential affinity and allows, in this case, a "pseudo-equitable" distribution of the blocks of the block copolymer on the surface of the substrate. Such a layer is said to be "pseudo-neutral" because it allows an equitable or "pseudo-equitable" distribution of the blocks of the block copolymer on the surface of the substrate, so that the layer, as a whole, has no preferential affinity for any of the blocks of the block copolymer. Consequently, such a chemically epitaxied layer on the surface of the substrate is considered as being neutral with respect to the block copolymer.

The block copolymer film is then deposited on the previously neutralized substrate surface. Then the prepolymer composition layer is deposited on the upper surface of the block copolymer and is successively doubly crosslinked to create crosslinked primary areas and secondary areas having an affinity, with respect to the blocks of the underlying block copolymer, opposite with respect to each another. Such a double crosslinking of the entire prepolymer layer allows a contrast layer to be obtained while avoiding the appearance of the phenomenon of dewetting of the block copolymer and the problems of increased thickness linked to the use of two different top coats with opposite affinity to be overcome. With the top coat-like interface material thus doubly crosslinked, the block copolymer can then be annealed at its assembly temperature in order to nanostructure it. Areas, located under the areas of the interface material with neutral affinity, where the nanodomains are oriented perpendicular to the interfaces, and areas, located under the areas of the interface material with preferential affinity for one of the blocks, where the nanodomains are oriented parallel to the interfaces, are created.

Preferably, the assembly temperature Tass of the block copolymer is lower than the glass transition temperature Tg of the top coat-like interface material layer, in its crosslinked form or at least lower than a temperature at which the interface material behaves as a viscoelastic fluid. This temperature then lies in a temperature range, corresponding to this viscoelastic behavior, above the glass transition temperature Tg of the TC-type interface material.

As regards the first and second stimulation allowing the successive crosslinking of the primary and secondary areas of the prepolymer composition layer, each of them can be selected from light radiation, ion bombardment, thermal stimulation, plasma, or an electrochemical process.

The two successive stimulations can be of different natures or an identical nature. However, if they are identical, the selective activation of each crosslinking agent Ac1, Ac2 is done by selecting a different stimulation setting. Thus, for example, if the two successive stimulations are carried out by ultraviolet (UV) radiation, then the activation wavelength of each crosslinking agent Ac1, Ac2 is different. Similarly, if the two successive stimulations are carried out thermally, the activation temperature of each crosslinking agent is different.

The first stimulation will preferably be carried out by light irradiation, for example under ultraviolet UV radiation, or by electron beam, or possibly by means of a localized thermal stimulus.

The second stimulation will preferably be carried out by light irradiation for example under ultraviolet UV radiation, or by thermal stimulation.

Thus, among the possible successive stimulations, the following will be preferred: UV+UV or UV+thermal, or electron beam+UV, or electron beam+thermal.

In a particularly advantageous embodiment, the first stimulation allowing the reaction for crosslinking the primary areas of the prepolymer composition layer is activated by locally exposing the layer to light radiation, such as radiation in wavelength ranges ranging from ultraviolet to infrared. Preferably, the illumination wavelength is between 10 nm and 1500 nm and more preferably, it is between 100 nm and 500 nm. In a particular embodiment, the light source for exposing the layer to the light radiation may be a laser device. In such a case, the wavelength of the laser will preferably be centered on one of the following wavelengths: 436 nm, 405 nm, 365 nm, 248 nm, 193 nm, 172 nm, 157 nm, or 126 nm. Such a crosslinking reaction has the advantage of being performed at ambient or moderate temperature, preferably less than or equal to 150° C., and more preferably less than or equal to 110° C. It is also very fast, from about a few seconds to a few minutes, preferably less than 2 minutes. Preferably, the constituent compounds of the prepolymer composition layer, before crosslinking, are stable in solution as long as they are protected from exposure to the light source. They are therefore stored in opaque containers. When such a prepolymer layer is deposited on the underlying block copolymer film, the constituents, which are stable in solution, are subjected to the localized light radiation allowing the primary areas of the layer to be crosslinked over a truly short period (typically less than 2 minutes).

Depending on the means used for irradiation, it can be carried out through a lithography mask, preferably a photolithography mask, or not. The use of a laser device, for example, allows certain areas to be precisely irradiated without the need for a mask.

Thanks to this first localized irradiation of the prepolymer layer, a crosslinking reaction of the molecular chains constituting the exposed primary areas of the prepolymer layer takes place in situ, within the prepolymer layer, and generates the creation of crosslinked primary areas.

In any case, care must be taken to ensure that the light wavelength used for the crosslinking of the primary areas of the interface material layer does not interfere or only slightly with the components of the underlying block copolymer BCP, so as to avoid possible photo-induced degradation thereof. The selection of the first crosslinking agent Ac1, which can for example be selected from a radical photoinitiator (PI), a photo-generated acid (PAG), or a photo-generated base (PBG), should therefore be carried out in such a way that the light radiation does not degrade the block copolymer. However, in general, the photo-crosslinking is particularly efficient, with a high quantic yield, even at a low energy dose (typically from a few millijoules per square centimeter ($mJ/cm^2$) to a few tens of $mJ/cm^2$, for example for doses equivalent to the lithography processes commonly used for exposure of photosensitive resins at 193 nm), as opposed to the degradation of the block copolymer at the same wavelength which generally requires a higher dose (typically, for example, from 200 $mJ/cm^2$ to 1000 $mJ/cm^2$ at 193 nm for polymethyl methacrylate PMMA). Consequently, even with a coating with an interface material, the primary areas of which are photo-crosslinked at a degradation wavelength of the underlying block copolymer, the energy dose remains sufficiently low so as not to damage the block copolymer BCP. Preferably, the energy dose during the photo-crosslinking is less than or equal to 200 $mJ/cm^2$, more preferably it is less than or equal to 100 $mJ/cm^2$ and even more preferably, it is less than or equal to 50 $mJ/cm^2$.

In order to obtain crosslinked areas which are neutral with respect to the underlying block copolymer, that is to say which do not have any particular affinity with respect to each of the blocks of the block copolymer, the prepolymer composition preferably comprises a multi-component mixture of derivatives bearing functions that ensure the crosslinking, but different chemical groups. Thus, for example, the composition could include a component with fluorinated groups, another with oxygenated groups, etc., in order to be able to finely modulate the surface energy specific to the areas of the layer, with neutral affinity once photo-crosslinked. Thus, among the molecules reacting by cationic photopolymerization with photo-generated acids PAGs to form a neutral crosslinked area, mention can be made, for example, of oligomers formed from a monomer of a low surface energy, for instance a fluoro acrylate, a monomer of a medium to high surface energy, for instance a hydroxylated acrylate, and a crosslinkable group, via an acid reaction using a photo-generated acid, for instance an epoxy. In this case, the low surface energy monomer/high surface energy monomer ratio, weighted by the proportion of crosslinkable functional group GR, GR1, determines the neutrality of the crosslinked area with respect to the underlying block copolymer BCP. The rate of crosslinkable groups with respect to the nature of the molecules in the prepolymer composition determines the final rigidity of the crosslinked area. Finally, the physico-chemical structure of the photo-generated acid PAG determines its activation wavelength and solubility.

In another embodiment, the first stimulation can for example be carried out by means of an electron beam (noted e-beam). In this case, the equipment used for e-beam lithography can be, for example, a JEOL 6300FS instrument operating at 100 kV, the electron beam intensity of which is set at 5 nA. The exposure dose is for example between 30 µC/cm$^2$ and 180 µC/cm$^2$.

As for the second stimulation, allowing the secondary areas of the interface material layer to be crosslinked, it can be carried out under light radiation, or thermally, for example.

If it is carried out by light irradiation, then the selective activation of the second crosslinking agent Ac2 takes place by a different stimulation setting, that is to say in this case the activation wavelength of the second crosslinking agent Ac2 is different from the activation wavelength of the first crosslinking agent Ac1. For this purpose, the crosslinking agents Ac1 and Ac2 are selected so that their activation wavelengths are sufficiently far apart from each other so that the first stimulation intended to crosslink the primary areas does not cause the secondary areas to begin to crosslink. Thus, for example, if the first stimulation is carried out at a wavelength of 365 nm, then the second stimulation could be carried out at a wavelength of 436 nm or 193 nm.

When the second stimulation for crosslinking the secondary areas of the interface material layer carried out thermally, the crosslinking temperature Tr is preferably lower than the glass transition temperature Tg of the underlying block copolymer film in order to ensure the absence of a dewetting phenomenon. However, in some cases, the crosslinking temperature Tr may be higher than the glass transition temperature Tg of the underlying block copolymer film. In such a situation, the stack of the block copolymer film and the non-crosslinked secondary areas of the prepolymer composition layer is in a liquid/liquid configuration conducive to dewetting and inter-diffusion phenomena. A competition is then established between the crosslinking reaction of the secondary areas of the prepolymer composition to form the crosslinked secondary areas and the occurrence of a dewetting phenomenon of the secondary areas of the prepolymer composition layer deposited. In order to guarantee the complete absence of stack deformation, due to dewetting of the secondary areas of the prepolymer composition layer before they completely crosslink, it must therefore be ensured in this case that the crosslinking reaction is significantly faster than the hydrodynamic processes leading to dewetting.

To this end, the thermal catalyst ThCa is advantageously selected depending on its catalytic activity, but also depending on the activation temperature at which it allows crosslinking to be activated. The temperature Tr of the crosslinking reaction can indeed be selected so as to obtain a faster crosslinking speed than the dewetting kinetics, without, however, damaging the stack.

For this purpose, a so-called "flash" crosslinking, lasting from a few seconds to a few tens of seconds, for example between 2 and 50 sec, can be advantageously considered in order to make sure that no dewetting takes place. Amines or polyamines, such as diethylene triamine (DTA), isophorone diamine (IPD), 4,4'-diaminodiphenylsulfone (DDS), hexamethylene diamine (HMDA), dicyandiamide (cyanoguanidine), or ammonium salts, such as ammonium triflate or ammonium trifluoroacetate, or ascorbic acid and its derivatives, selected from sodium or magnesium ascorbate or sodium, magnesium or ammonium ascorbylphosphate, as well as the various possible isomers (diastereoisomers, enantiomers) of ascorbic acid; uric acid; phenol, polyphenols and phenolic derivatives such as hydroquinone, resorcinol, 2,4-pentanedione, malonaldehyde (propanedial), tartronaldehyde (2-hydroxypropanedial), furanone, and more generally reductones, appear as catalysts of choice because not only do they allow a rapid crosslinking reaction, with kinetics less than or equal to 3 minutes, but they also allow the crosslinking temperature of the polymer to be lowered in a more accessible temperature range, typically below 300° C., and preferably below 250° C., and even more preferably below 150° C.

If the crosslinking reaction takes place as a free-radical reaction, the crosslinking agent Ac2 may also be selected from thermal radical initiators TRI, such as chemical derivatives of the organic peroxide type, or derivatives having a chemical function of the azo-type, such as azobisisobutyronitrile, or derivatives of the alkyl halide type. In this case too, the catalyst allows a rapid crosslinking reaction to be obtained, with kinetics less than or equal to 3 minutes, at a temperature below 300° C., preferably below 250° C., and even more preferably below 150° C.

This second stimulation can be achieved simply by subjecting the stack obtained after the first stimulation, either by light irradiation or by subjecting to an electron beam, to a post-exposure bake, denoted PEB (from the English acronym "Post Exposure Bake"). Such an annealing allows the photo-generated species to be diffused during the first irradiation and the thermal catalyst ThCa of the second, not exposed, portion (secondary areas), to be activated.

In general, whether the first stimulation is carried out by light irradiation or by electron beam, a post-exposure bake PEB is carried out at a temperature preferably below 100° C., for a period of less than or equal to 3 minutes, to allow the diffusion of the photo-generated acid during the first stimulation, into the prepolymer composition layer, for activating the second crosslinking agent Ac2, selected from a thermal catalyst ThCa or a thermal radical initiator TRI, in order to initiate the second crosslinking of the secondary areas of the prepolymer composition layer.

This second stimulation can, in an alternative embodiment, be carried out by means of a local thermal source. This local thermal source can be an infrared laser for example, or a lamp with a broad infrared spectrum through a lithography mask, for which a set of wavelengths is used rather than a restricted range as in the case of laser-type radiation, or via a mechanical means such as a heating tip of an atomic force microscope, or a "roll-to-roll"-type process, in which a heated nanostructured roll is brought into contact with the surface of the secondary areas of the prepolymer composition layer by printing. Such a localized thermal treatment of the secondary areas of the prepolymer layer also allows for a "flash"-type crosslinking.

Thus, the localized double crosslinking of the primary and secondary areas of the prepolymer composition layer not only allows problems of inter-diffusion and dewetting of this layer on the underlying block copolymer to be avoided, but also the block copolymer layer to be stabilized so that it does not dewet from its substrate. The crosslinking of the interface material layer thus allows a stack to be obtained, the surface of which is perfectly flat, with perfectly clear substrate/block copolymer and block copolymer/interface material interfaces.

Such a layer of interface material thus crosslinked has a contrasting surface energy at the temperature allowing self-assembly of the underlying block copolymer BCP. Since the resulting interface material layer is contrasting, that is to say it has primary and secondary areas with opposite surface energy, the underlying block copolymer nanostructures, at its assembly temperature, so that its nanodomains orient themselves differently depending on whether they are located under the primary areas or under the secondary areas, with opposite affinities with respect to each another.

FIG. 2 schematizes the different possible pathways of crosslinking the prepolymer to obtain a material capable of forming a contrast layer.

Thus, for example, a first crosslinking agent Ac1 initiates crosslinking, in the primary areas, by reacting with a first crosslinkable functional group referenced GR or GR1 on pathways 1 to 6. The second crosslinking agent Ac2, chemically different from the first agent Act, can initiate the crosslinking reaction, in the secondary areas, by reacting with a crosslinkable functional group GR identical to the first GR, as shown in pathways 1, 2, and 3, or by reacting with another crosslinkable functional group GR2 different from the first GR1, as shown in pathways 4, 5, and 6.

One of the two crosslinking agents, for example the agent referenced Ac1 in FIG. 2, can further react with at least one functional monomer MFx in the polymer chain, as shown in pathways 3, 4, and 6. Such a reaction allows the contrast between the primary and secondary crosslinked areas to be increased.

The functional co-monomers MFx capable of reacting with a crosslinking agent Act, depending on the pathway selected, can be selected depending on the type of crosslinking agent Ac1 selected. For example, if the crosslinking agent Ac1 is a PAG, the reagent MF could be selected from (meth)acrylates with a good leaving group/nucleofuge as a substituent of the ester function, such as a tert-butyl, mesylate, or tosylate for example, for the direct acid-catalyzed hydrolysis of the ester function; or the substituent of the ester function could be an alkyl chain functionalized by an organic carbonate group, the carbonate then being cleaved by the PAG.

More particularly, in the case of pathway 1 as shown in FIG. 2, where both crosslinking agents Ac1 and Ac2 react with an identical crosslinkable functional group GR of the polymer chain, the contrast obtained is based solely on the difference in the final chemical structure obtained in the primary and secondary areas crosslinked with the first crosslinking agent Ac1 and the second crosslinking agent Ac2, respectively. This pathway appears to be the simplest to implement. However, depending on the crosslinking agents Ac1, Ac2 used, the contrast obtained may be low because only the difference in chemistry of the crosslinking agents Ac1 and Ac2 allows an affinity contrast with the underlying block copolymer to be obtained. However, low contrast does not always result in sufficient affinity to have a parallel orientation of the nanodomains of the underlying block copolymer or sufficient neutrality to have a perpendicular orientation of the nanodomains of the underlying block copolymer. When double crosslinking is carried out by this pathway 1, the selection of the crosslinking agents Ac1, Ac2 is therefore important to achieve sufficient contrast to allow for perpendicular or parallel orientation of the domains of the different areas of the underlying block copolymer. In this case, a PAG and a ThCa can be used, for example. A post-exposure bake (PEB) following the exposure of the primary areas, following the activation of the PAG, allowing the propagation of the generated acids also acting as ThCa activator, thus leads to a very simple process in terms of steps and use, with the steps consisting of localized irradiation, post-exposure bake, and then annealing at the assembly temperature of the block copolymer so that it nanostructures and its nanodomains orient differently according to the neutral or affine areas of the overlying contrast layer.

As regards pathway 2, it differs from pathway 1 in that the first crosslinking agent Ac1 is carried by the polymer chain of the prepolymer. Pathways 5 and 6 schematize the case where both crosslinking agents Ac1 and Ac2 are carried by the polymer chain. Preferably, when only one of the crosslinking agents is carried by the polymer chain, it is preferably the agent Ac1 for generating the primary crosslinked areas at the end of the first stimulation, in order to avoid any demixing problem between the crosslinking agent and the polymer, at the time of crosslinking.

Pathway 3 differs from pathway 1 in that one of the crosslinking agents Act, in addition to reacting with a crosslinkable functional group GR, also reacts with a functional monomer MFx of the polymer chain. Such an additional reaction significantly increases the chemical contrast between the primary and secondary crosslinked areas, and thus the affinity contrast with respect to the blocks of the underlying block copolymer.

Pathway 4 differs from pathway 3 in that each crosslinking agent Ac1 and Ac2 reacts with a different crosslinkable functional group GR1, GR2, so that the resulting contrast between the primary and secondary crosslinked areas is further enhanced. Pathway 5 differs from the previous pathways in that both crosslinking agents Ac1 and Ac2 are carried by the polymer chain and each agent reacts with a different crosslinkable functional group, GR1 and GR2, respectively.

Pathway 6 differs from pathway 5 in that one of the crosslinking agents Act, in addition to reacting with a crosslinkable functional group GR1, different from the crosslinkable group GR2 with which the second crosslinking agent Ac2 reacts, also reacts with a functional monomer MFx of the polymer chain. Pathway 6 therefore allows the chemical contrast between the primary and secondary crosslinked areas to be further increased.

The preferred pathways will be mainly pathways 3, 4, and 6 which provide the best contrasts.

The proportions of crosslinking agents are also important for obtaining a significant difference in surface energy between the primary and secondary areas, so that areas with nanodomains oriented perpendicular or parallel to the interfaces can be obtained in the underlying block copolymer. Preferably, each crosslinking agent Ac1, Ac2 is present in the prepolymer composition with a content less than or equal to 30% of the total mass of said prepolymer composition.

According to one embodiment, the underlayer for neutralizing the surface of the substrate may also comprise, in its composition, either a photo-generated acid (PAG), a photo-generated base (PBG), or a PI-type radical generator, directly integrated into the polymer chains of the material constituting the underlayer, or added as an additive to the material. In this case, care should be taken to select a block copolymer that does not absorb the light radiation used to carry out the first stimulation. Thus, at the time of the first localized stimulation of the prepolymer layer, the underlayer is simultaneously irradiated. This alternative also allows an affinity contrast to be created in the underlayer and the possibilities of organizing the nanodomains of the block copolymer to be increased.

EXAMPLES

Example 1

This example consists in structuring an interface material by double crosslinking of a prepolymer composition layer deposited on a block copolymer film. The prepolymer composition corresponds to that of pathway 1 in FIG. 2, the first stimulation is carried out under UV irradiation and the second crosslinking is carried out thermally.

The substrates used are "monitor"-grade silicon samples, oriented on the [1, 0, 0] crystallographic side, 3 cm×3 cm. They are cleaved from a 200 mm diameter substrate, and the resulting samples are then passed under a nitrogen flow to remove the dust due to cleavage.

An underlayer is dispensed onto the substrate by spin-coating at 2000 rpm (revolutions/minute) to obtain a film with a thickness of the order of 40 nm, and then it is heated at 240° C. for two minutes so as to be crosslinked. The residual film can be rinsed with PGMEA (propylene glycol methyl ether acetate) to remove not crosslinked chains. The underlayer used comprises a copolymer of poly(glycidyl methacrylate-co-trifluoroethyl methacrylate-co-hydroxyethyl methacrylate) (abbreviated "PGFH" hereinafter), in solution in methyl isobutyl ketone (MIBK) at 2 wt. %, and then mixed with a thermal catalyst such as ammonium triflate (in 2% MIBK solution) at 9:1 by mass, allowing the underlayer to be thermally crosslinked. Such a layer thus deposited and then crosslinked has a neutral affinity with respect to the block copolymer intended to be deposited on its surface.

The block copolymer used is a lamellar PDMSB-b-PS (poly(dimethylsilacyclobutane)-b-poly(styrene)) with a period L0=18 nm. It was synthesized by sequential anionic polymerization, as already reported in the previous art (K. Aissou et al., Small, 2017, 13, 1603777). The block copolymer has a number average molar mass (Mn) of 17,000 g/mol, with a polydispersity index of 1.09. The characterization shows a composition of 51% (by mass) PS and 49% PDMSB. The BCP is dissolved in methyl isobutyl ketone (MIBK) at 0.9 wt. %, and then filtered to remove particles larger than 200 nm in diameter. The BCP is dispensed onto the previously neutralized substrate by spin coating at 2000 rpm to obtain a film with a thickness of the order of 30 nm, and then the resulting stack is heated at 60° C. for 1 minute to remove the residual solvent from the BCP film.

The prepolymer used has a poly(glycidyl methacrylate-co-trifluoroethyl methacrylate-co-hydroxyethyl methacrylate) (abbreviated "PGFH" hereinafter) copolymer architecture of variable "GFH" compositions, ranging from 25/0/75 to 25/47/28, in mass compositions. The prepolymer is solubilized in an alcoholic solution, either pure ethanol or an ethanol-PGME (propylene glycol methyl ether) mixture, the proportions of which range from 20/80 to 5/95, at 2 wt. %.

A first crosslinking agent of the PAG type, such as 4-thiophenyl phenyl diphenyl sulfonium triflate, in solution in absolute ethanol, and a second crosslinking agent of the thermal catalyst ThCa type, such as ammonium triflate, also in solution in ethanol, at 2 wt. % are used. The different solutions of prepolymer and crosslinking agent are filtered to remove particles, and then mixed to obtain a prepolymer composition with the prepolymer/PAG/ThCa proportions at 9/2/1 by mass.

The solution of prepolymer composition thus obtained is then dispensed onto the BCP film by spin-coating at 2000 rpm to obtain a film with a thickness of the order of 45 nm.

The stack thus created is then exposed by UV radiation, to a wavelength of 365 nm, through a photolithography mask, at a dose of the order of 300 mJ/cm$^2$, to create a first portion, comprising primary areas receiving the UV radiation and crosslinking, and a second portion, comprising secondary areas which are free from this exposure.

The stack is then heated at 90° C. for 3 minutes in order to diffuse the photo-generated acids into the prepolymer layer and to activate the second crosslinking agent ThCa in the second non-exposed portion. Thus, the secondary areas of the second portion are thermally crosslinked.

A crosslinked contrast layer is then obtained at the upper interface of the block copolymer, comprising primary and secondary areas having with opposite affinities with respect to each another, with respect to the underlying block copolymer.

The stack is then thermally annealed at 260° C. for 5 minutes in order to assemble the block copolymer. The nanodomains of the block copolymer then orient in a perpendicular or parallel manner to the interfaces, depending on whether they are under a neutral or an affine area of the contrast layer, respectively.

The doubly crosslinked, contrast-forming upper interface material is then removed by plasma etching with an oxygen-based plasma, in a single etching step.

Example 2

The same steps as in Example 1 are carried out. This example differs from Example 1 only in the composition of the prepolymer used, which is a copolymer with a poly (glycidyl methacrylate-co-hydroxyethyl methacrylate-co-tert-butyl acrylate) architecture with a 20/40/40 composition.

The different areas of each sample of nanostructured block copolymer BCP in Examples 1 and 2 are characterized by CD-SEM imaging, to determine the orientation of the BCP lamellae depending on the areas of the contrast layer that have undergone the first or second stimulation. The samples were analyzed by scanning electron microscopy (SEM) on a CD-SEM H9300 from Hitachi. The results obtained are shown in FIGS. 3A and 3B, which represent SEM images of two UV and thermally crosslinked areas of the nanostructured block copolymer after the interface material structuring method in Example 1 (FIG. 3A) and the nanostructured block copolymer after the interface material structuring method in Example 2 (FIG. 3B), respectively.

It appears that, depending on the prepolymer composition, the contrast layer comprises a neutral affinity area which may correspond to that which has undergone the first stimulation by UV radiation or to that which has undergone the second thermal crosslinking.

Figure 3A:
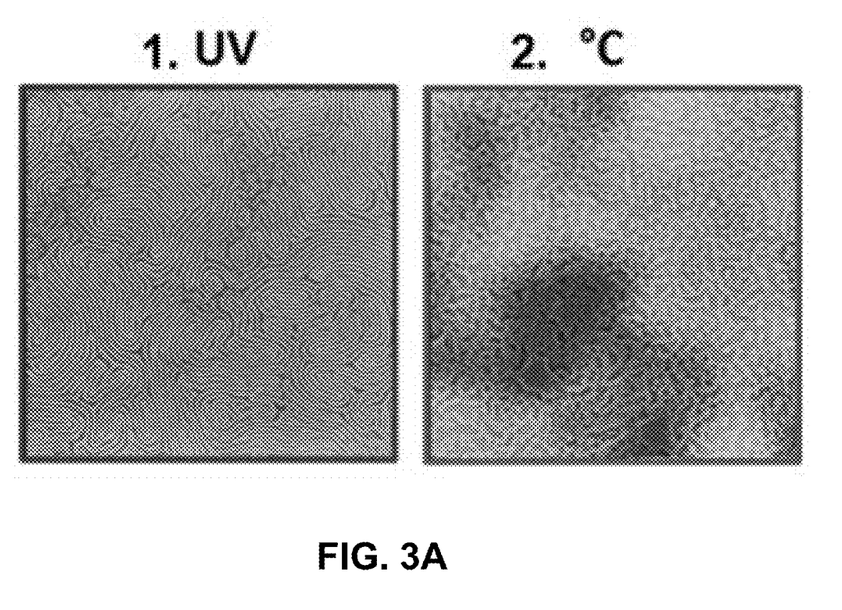
Figure 3B:
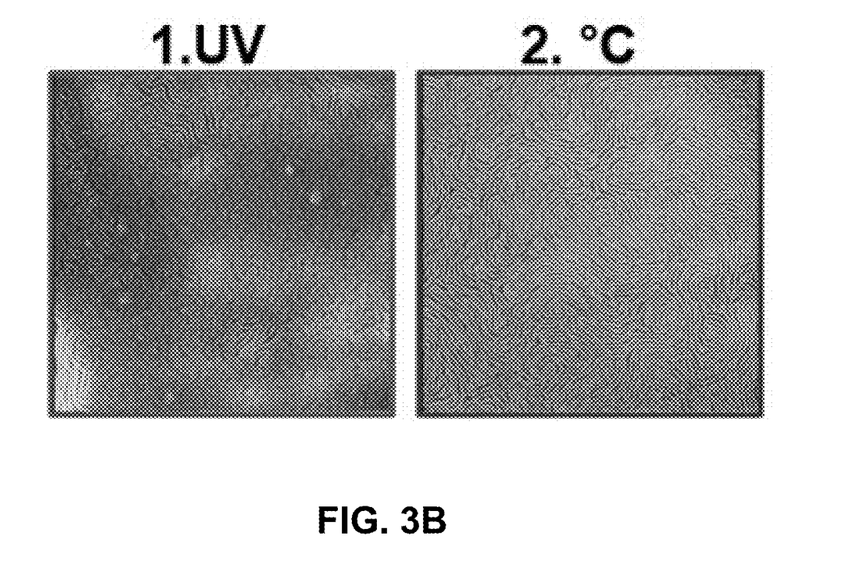
FIG. 3B A scanning electron microscope photograph of different areas of a nanostructured block copolymer after structuring an interface material by two successive crosslinking reactions of a second prepolymer composition.

FIG. 3A shows the photographs obtained for the block copolymer in Example 1, nanostructured after the double crosslinking of the contrast layer in Example 1. In this first case, the nanodomains are perpendicular to the interfaces in the areas located under the primary areas of the contrast layer, which have undergone the first UV stimulation, while they are parallel to the interfaces in the areas located under the secondary areas of the contrast layer, obtained after thermal crosslinking. Conversely, in FIG. 3B, the block copolymer in Example 2 shows nanodomains perpendicular to the interfaces in the areas located under the secondary areas of the contrast layer, that is to say under the areas that have undergone the second thermal crosslinking, while the nanodomains are parallel to the interfaces in the areas located under the primary areas of the contrast layer, which have undergone the first stimulation bu UV radiation.

These photographs demonstrate that depending on the prepolymer composition, the surface energy of the primary and secondary areas of the contrast layer obtained after double crosslinking can vary.

The above examples therefore demonstrate that a single interface material can be obtained with a dual behavior, neutral or affine, with respect to the underlying BCP block copolymer depending on the crosslinking method followed and the prepolymer composition used. Thanks to the invention, it becomes possible to control at will the orientation of the nanodomains of the block copolymer BCP, while considerably limiting dewetting phenomena thereof and simplifying the removal method of the top coat-like interface material.

The invention claimed is:

1. A method for structuring an interface material deposited on a block copolymer film, comprising the following steps:
   depositing, on said block copolymer film, a prepolymer composition layer thereby creating a stack, said block copolymer comprising, on the one hand, a plurality of functional monomers and at least one crosslinkable functional group within its polymer chain and, on the other hand, two chemically different crosslinking agents, each agent being adapted to initiate crosslinking of said prepolymer in response to a stimulation specific thereto,
   subjecting the stack thus created to a first stimulation localized on first areas, said first stimulation being selected from light radiation, ion bombardment, thermal stimulation, plasma, or an electrochemical process, so as to cause a crosslinking reaction of the molecular chains of said prepolymer by the action of a first one of crosslinking agents in said first areas subjected to said first stimulation, said first crosslinked areas obtained having a first affinity with respect to blocks of the underlying block copolymer,
   subjecting the stack to a second stimulation selected from light radiation, ion bombardment, thermal stimulation, plasma, or an electrochemical process, so as to cause a crosslinking reaction of the molecular chains of said prepolymer by the action of a second one of said crosslinking agents in secondary areas not crosslinked after the first stimulation, said crosslinked secondary areas obtained, adjacent to the first areas, having a second affinity with respect to the blocks of the underlying block copolymer, the second affinity being opposite to the first affinity.

2. The method according to claim 1, wherein the first crosslinking agent initiates crosslinking by reacting with a first crosslinkable functional group of the polymer chain, while the second crosslinking agent initiates crosslinking by reacting with a second crosslinkable functional group identical to or different from the first one.

3. The method according to claim 1, wherein one of the two crosslinking agents further reacts with at least one functional monomer of the polymer chain.

4. The method according to claim 1, wherein either or both of the crosslinking agents is/are carried by the polymer chain of said prepolymer.

5. The method according to claim 1, wherein the functional monomers of the polymer chain of said prepolymer are acrylate or diacrylate or triacrylate or multi-acrylate, methacrylate, or multi-methacrylate, or polyglycidyl or vinyl, fluoroacrylate or fluoromethacrylate, vinyl fluoride or fluorostyrene, alkyl acrylate or methacrylate, hydroxyalkyl acrylate or methacrylate, alkylsilyl acrylate or methacrylate derivatives, unsaturated esters/acids such as fumaric or maleic acids, vinyl carbamates and carbonates, allyl ethers, and thiol-ene systems.

6. The method according to claim 1, wherein the crosslinkable functional group(s) of the polymer chain of said prepolymer is a derivative (derivatives) having chemical functions of the epoxy/oxirane, oxetane, thiirane or vinyl ether, cyclic ether, trioxane, vinyl, lactone, lactam, carbonate, thiocarbonate, maleic anhydride, oracrylate type substituted by a carbon chain having one or more unsaturations.

7. The method according to claim 1, wherein the crosslinking agents are selected from:
   acids photo-generated from a salt selected from onium salts, such as iodonium, sulfonium, pyridinium, alkoxypyridinium, phosphonium, oxonium, or diazonium salts;
   bases photo-generated from derivatives selected from carbamates, acyloximes, ammonium salts, sulfonamides, formamides, amineimides, α-aminoketones, amidines;
   thermally activatable catalysts selected from chemical derivatives for generating a thermally activated acid proton, such as ammonium salts like ammonium triflate, ammonium trifluoroacetate, or ammonium trifluoromethane sulfonate, pyridinium salts such as pyridinium para-toluenesulfonate, phosphoric or sulfuric or sulfonic acids, or onium salts such as iodonium or phosphonium salts, or imidazolium salts, amines or polyamines, such as diethylene triamine, isophorone diamine, 4,4'-diaminodiphenylsulfone, hexamethylene diamine, dicyandiamide (cyanoguanidine), or ascorbic acid and its derivatives, selected from sodium or magnesium ascorbate or sodium, magnesium or ammonium ascorbylphosphate, as well as the various possible isomers (diastereoisomers, enantiomers) of ascorbic acid; uric acid; phenol, polyphenols and phenolic derivatives such as hydroquinone, resorcinol, 2,4-pentanedione, malonaldehyde (propanedial), tartronaldehyde (2-hydroxypropanedial), furanone and more generally reductones;
   thermal radical initiators selected from derivatives of the organic peroxide type, or derivatives having an azo-type chemical function, such as azobisisobutyronitrile, or derivatives of the alkyl halide type;
   radical photoinitiators selected from acetophenone, benzophenone, organic peroxides, phosphines, xanthones, thioxanthones, quinones, α-hydroxyketones or diazonaphthoquinone, α-aminoketones, benzil, benzoin derivatives.

8. The method according to claim 1, wherein each crosslinking agent is present in the prepolymer composition with a content less than or equal to 30% of a total mass of said prepolymer composition.

9. The method according to claim 1, wherein said first localized stimulation is carried out through a lithographic mask.

10. The method according to claim 1, wherein the second localized stimulation is carried out through a lithography mask.

11. The method according to claim 1, wherein when the first stimulation and the second stimulation are of an identical nature, and a selective activation of each crosslinking agent is carried out by selecting a different stimulation setting.

12. The method according to claim 1, wherein a preliminary step comprises depositing the block copolymer, capable of nanostructuring at an assembly temperature, on a surface of an underlying substrate previously neutralized, said neutralization of the underlying substrate being obtained by depositing and crosslinking a neutral underlayer of a carbon or fluorocarbon type, with a thickness greater than 1.5 times a thickness of the block copolymer film.

13. The method according to claim 1, wherein a preliminary step comprises depositing the block copolymer, capable of nanostructuring at an assembly temperature, on a surface of an underlying substrate previously neutralized, said neutralization of the underlying substrate being obtained by depositing and grafting an underlayer of neutral random copolymer on the substrate.

14. The method according to claim 12, wherein the neutral underlayer comprises either a photo-generated acid, a photo-generated base, or a radical generator of a photoinitiator type, directly integrated into polymer chains of the underlayer material or added as an additive to the material.

15. The method according to one of claim 12, wherein another preliminary step comprises predrawing patterns on the previously neutralized surface of the substrate, said patterns being predrawn by a lithography step or a sequence of lithography steps of any nature prior to the step of depositing said block copolymer film, said patterns being configured to guide organization of said block copolymer by a so-called chemoepitaxy or graphoepitaxy technique, or a combination of these two techniques.

16. A crosslinkable prepolymer composition configured to form a contrast layer on a block copolymer film, said crosslinkable prepolymer composition comprising: a prepolymer comprising a plurality of functional monomers and at least one crosslinkable functional group within its polymer chain, a first crosslinking agent adapted to initiate crosslinking of said prepolymer in response to a specific stimulation thereto to form a first crosslinked area having a first affinity with respect to blocks of the block copolymer film, and a second crosslinking agent that is chemically different from the first crosslinking agent and that is adapted to initiate crosslinking of said prepolymer in response to a specific stimulation thereto to form a second crosslinked area having a second affinity with respect to the blocks of the block copolymer film, wherein said second affinity is opposite to the first affinity.

17. The prepolymer composition according to claim 16, wherein one of the first or second crosslinking agents is adapted to react with a crosslinkable functional group and also with a functional monomer of the polymer chain.

18. The prepolymer composition according to claim 16, wherein each of the first and second crosslinking agents reacts with a different crosslinkable functional group.

19. The prepolymer composition according to claim 16, wherein the first and the second crosslinking agents and are carried by the polymer chain and each of the first and the second crosslinking agents reacts with a different crosslinkable functional group, respectively.

20. The prepolymer composition according to claim 19, wherein one of the first or the second crosslinking agents, in addition to reacting with a crosslinkable functional group different from the crosslinkable group with which first or the second crosslinking agent reacts, also reacts with a functional monomer of the polymer chain.

21. A contrast layer obtained by double crosslinking of the prepolymer composition according to claim 16, said contrast layer forming a top coat-like upper interface material, deposited on the block copolymer film.

22. A contrast layer obtained by double crosslinking of the prepolymer composition according to claim 16, said contrast layer forming an underlayer deposited at the interface between a substrate and the block copolymer film.

23. A contrast layer obtained by double crosslinking of the prepolymer composition according to claim 16, said contrast layer forming patterns, made on a previously neutralized surface of a substrate by a graphoepitaxy technique and intended to guide the organization of a block copolymer.

* * * * *